United States Patent
Backhaus-Ricoult et al.

(10) Patent No.: US 8,628,680 B2
(45) Date of Patent: Jan. 14, 2014

(54) REDUCED OXIDES HAVING LARGE THERMOELECTRIC ZT VALUES

(75) Inventors: Monika Backhaus-Ricoult, Horseheads, NY (US); Charlene Marie Smith, Corning, NY (US); Todd Parrish St Clair, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 228 days.

(21) Appl. No.: 13/192,842

(22) Filed: Jul. 28, 2011

(65) Prior Publication Data

US 2013/0026427 A1 Jan. 31, 2013

(51) Int. Cl.
*H01L 35/22* (2006.01)

(52) U.S. Cl.
USPC ............. 252/62.3 T; 136/238; 136/239

(58) Field of Classification Search
USPC ............. 252/62.3 T; 136/238, 339, 239
See application file for complete search history.

(56) References Cited

U.S. PATENT DOCUMENTS

| 7,670,711 | B2 * | 3/2010 | Marina et al. ............... 429/411 |
| 2004/0265669 | A1 | 12/2004 | Yoo et al. |
| 2005/0250000 | A1 * | 11/2005 | Marina et al. ............... 429/40 |
| 2006/0210864 | A1 * | 9/2006 | Eguchi et al. ............... 429/44 |

FOREIGN PATENT DOCUMENTS

WO WO 2008/109564 * 9/2008

OTHER PUBLICATIONS

Muta, et.al "Thermoelectric properties of rare earth doped SrTiO3" J. Alloys and Compounds 350 (2003) 292-295.
Muta, et. al "Thermoelectric properties of doped BaTiO3-SrTiO3 solid solutions" J. Alloys and Compounds 368 (2004) 22-24.
Wang, et. al "Substitution effect on the thermoelectric properties of reduced Nb-doped Sr0.95La0.05TiO3 ceramics" J. Alloys and Compounds 486 (2009) 693-696.
Ohta, et al "Grain size dependence of thermoelectric performance of Nb-doped SrTiO3 polycrystals" J. Ceram. Soc. Japan 114 (2006) 102-105.
Q.X. Fu et al; "Ceramic-Based Anode Materials for Improved Redox Cycling of Solid Oxide Fuel Cells"; Fuel Cells Aug. 2008 No. 5, 283-203.
Q.X. Fur et al; "Influence of Sintering Conditions on Microstructure and Electrical Conductivity of Yttrium-Substituted SrTiO3"; Journal of the European Ceramic Society 28 (2008) 811-823.
Marina et al; "Thermal, Electrical, and Electrocatalytical Properties of Lanthanum-Doped Strontium Titanate"; Solid State Ionics 149 (2002) 21-28.
Sun et al; "Yttrium-Doped Effect on Thermoelectric Properties of $La_{0.1}Sr_{0.9}TiO_3$ Ceramics"; J Mater Sci (2011) 46: 5278-5281.
PCT/US2012/046834 Search Report.

* cited by examiner

*Primary Examiner* — Carol M Koslow
(74) *Attorney, Agent, or Firm* — Michael W. Russell

(57) ABSTRACT

Doped and partially-reduced oxide (e.g., $SrTiO_3$-based) thermoelectric materials. The thermoelectric materials can be single-doped or multi-doped (e.g., co-doped) and display a thermoelectric figure of merit (ZT) of 0.2 or higher at 1050K. Methods of forming the thermoelectric materials involve combining and reacting suitable raw materials and heating them in a graphite environment to at least partially reduce the resulting oxide. Optionally, a reducing agent such as titanium carbide can be incorporated into the starting materials prior to the reducing step in graphite. The reaction product can be sintered to form a dense thermoelectric material.

12 Claims, 10 Drawing Sheets

REDUCED OXIDES HAVING LARGE THERMOELECTRIC ZT VALUES

BACKGROUND

The present disclosure relates to thermoelectric materials that can be used in thermoelectric devices for electric power generation, and more particularly to partially-reduced, doped oxides that have a high thermoelectric figure of merit.

Thermoelectric materials can be used to generate electricity when exposed to a temperature gradient according to the thermoelectric effect. Notably, a thermoelectric device such as a thermoelectric power generator can be used to produce electrical energy, and advantageously can operate using waste heat such as industrial waste heat generated in chemical reactors, incineration plants, iron and steel melting furnaces, and in automotive exhaust. Efficient thermoelectric devices can recover about 5% or more of the heat energy released by such industrial systems, though due to the "green nature" of the energy, lower efficiencies are also of interest. Compared to other power generators, thermoelectric power generators operate without toxic gas emission, and with longer lifetimes and lower operating and maintenance costs The conversion of thermal energy into electrical energy is based on the Seebeck effect, a phenomenon that describes the formation of an electrical potential in a material that is exposed to a thermal gradient. The Seebeck voltage, $\Delta U$, also referred to as the thermopower or thermoelectric power of a material, is the induced thermoelectric voltage in response to a temperature difference across that material. The Seebeck coefficient S is defined as the limit of that thermoelectric voltage when the temperature gradient goes to zero, $$S = \lim \frac{\Delta U}{\nabla T}$$

and has units of $VK^{-1}$, though typical values are in the range of microvolts per Kelvin.

A thermoelectric device typically includes two types of semiconducting material (e.g., n-type and p-type) though thermoelectric devices comprising a single thermoelectric material (either n-type or p-type) are also known. Conventionally, both n-type and p-type conductors are used to form n-type and p-type elements within a device. In a typical device, alternating n-type and p-type elements are electrically connected in series and thermally connected in parallel between electrically insulating but thermally conducting plates. Because the equilibrium concentration of carriers in a semiconductor is a function of temperature, a temperature gradient in the material causes carrier migration. The motion of charge carriers in a device comprising n-type and p-type elements will create an electric current.

For purely p-type materials that have only positive mobile charge carriers (holes), S>0. For purely n-type materials that have only negative mobile charge carriers (electrons), S<0. In practice, materials often have both positive and negative charge carriers, and the sign of S usually depends on which carrier type predominates.

The maximum efficiency of a thermoelectric material depends on the amount of heat energy provided and on materials properties such as the Seebeck coefficient, electrical conductivity and thermal conductivity. A figure of merit, ZT, can be used to evaluate the quality of thermoelectric materials. ZT is a dimensionless quantity that for small temperature differences is defined by $ZT=\sigma S^2 T/\kappa$, where $\sigma$ is the electric conductivity, S is the Seebeck coefficient, T is temperature, and $\kappa$ is the thermal conductivity of the material. Another indicator of thermoelectric material quality is the power factor, $PF=\sigma S^2$.

A material with a large figure of merit will usually have a large Seebeck coefficient (found in low carrier concentration semiconductors or insulators) and a large electrical conductivity (found in high carrier concentration metals).

Good thermoelectric materials are typically heavily-doped semiconductors or semimetals with a carrier concentration of $10^{19}$ to $10^{21}$ carriers/$cm^3$. Moreover, to ensure that the net Seebeck effect is large, there should only be a single type of carrier. Mixed n-type and p-type conduction will lead to opposing Seebeck effects and lower thermoelectric efficiency. In materials having a sufficiently large band gap, n-type and p-type carriers can be separated, and doping can be used to produce a dominant carrier type. Thus, good thermoelectric materials typically have band gaps large enough to have a large Seebeck coefficient, but small enough to have a sufficiently high electrical conductivity. The Seebeck coefficient and the electrical conductivity are inversely related parameters, however, where the electrical conductivity is proportional to the carrier density (n) while the Seebeck coefficient scales with $3n^{-2/3}$.

Further, a good thermoelectric material advantageously has a low thermal conductivity. Thermal conductivity in such materials comes from two sources. Phonons traveling through the crystal lattice transport heat and contribute to lattice thermal conductivity, and electrons (or holes) transport heat and contribute to electronic thermal conductivity.

One approach to enhancing ZT is to minimize the lattice thermal conductivity. This can be done by increasing phonon scattering, for example, by introducing heavy atoms, disorder, large unit cells, clusters, rattling atoms, grain boundaries and interfaces.

Previously-commercialized thermoelectric materials include bismuth telluride- and (Si, Ge)-based materials. The family of $(Bi,Pb)_2(Te,Se,S)_3$ materials, for example, has a figure of merit in the range of 1.0-1.2. Slightly higher values can be achieved by selective doping, and still higher values can be reached for quantum-confined structures. However, due to their lack of chemical stability and low melting point, the application of these materials is limited to relatively low temperatures (<450° C.), and even at such relatively low temperatures, they require protective surface coatings. Other known classes of thermoelectric materials such as clathrates, skutterudites and silicides also have limited applicability to elevated temperature operation.

In view of the foregoing, it would be advantageous to develop thermoelectric materials (e.g., n-type and/or p-type) capable of efficient operation at elevated temperatures. More specifically, it would be advantageous to develop environmentally-friendly, high-temperature thermoelectric materials having a high figure of merit in the medium-to-high temperature range.

SUMMARY

These and other aspects and advantages of the invention can be achieved by a family of doped oxide materials that are at least partially reduced during their synthesis. The classes of oxides can include $SrTiO_3$-based materials. Reduction can be accomplished by heating and reacting suitable raw materials in a reducing environment (e.g., graphite environment). A complimentary reduction approach involves incorporating into the raw materials a reducing agent such as nano-size titanium carbide (TiC) particles, which are then heated and reacted to produce a partially-reduced oxide thermoelectric material. The resulting material can be sintered into dense elements using, for example, spark plasma sintering, and can exhibit ZT values of about 0.2 or higher at 1050K. Example dopants include niobium, lanthanum and yttrium, which can be incorporated separately or in combination. Embodiments include co-doped $SrTiO_3$ materials.

The disclosed $SrTiO_3$-based materials can be incorporated into a thermoelectric device. An exemplary method for forming such materials includes combining raw materials to form a mixture, surrounding the mixture with graphite, and heating the mixture to form a partially-reduced thermoelectric oxide material.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

DETAILED DESCRIPTION

Figure 1:
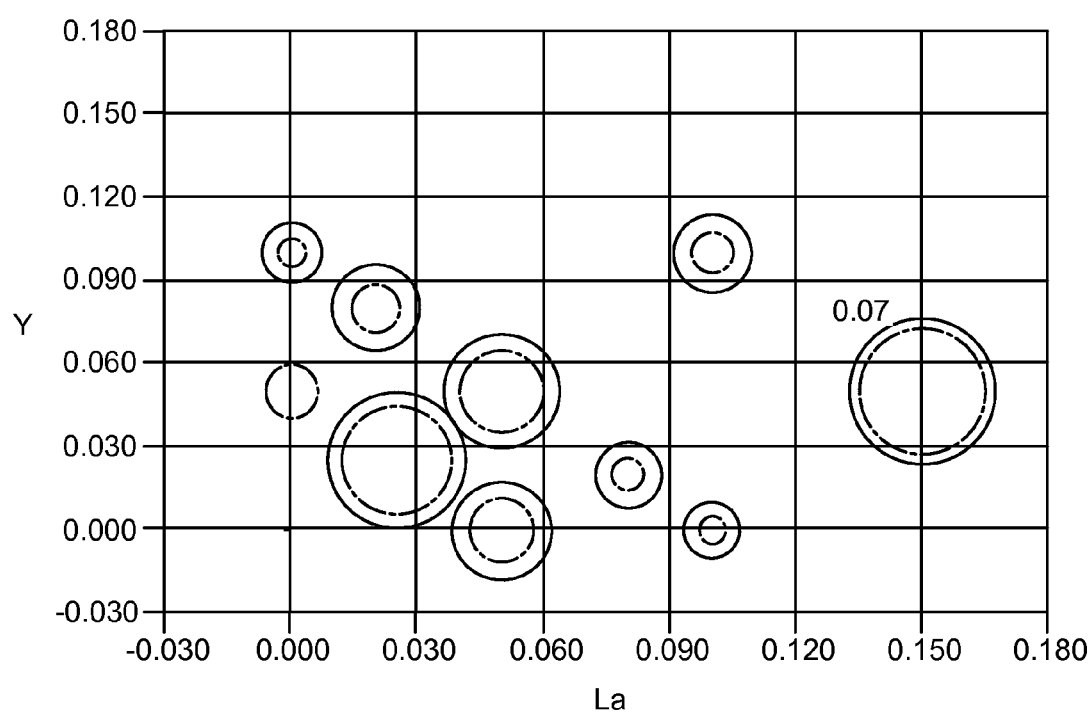
FIG. 1 shows thermoelectric figure of merit values as a function of Y- and/or La-doping in comparative, unreduced $SrTiO_3$-based materials.

The disclosure relates generally to high temperature thermoelectric materials and methods of making such materials. The inventive materials are doped and partially-reduced oxides optionally comprising a second phase. According to embodiments, nanoscale titanium carbide (TiC) can optionally be combined with strontium titanate ($SrTiO_3$) raw materials and the mixture can be heated and reacted under reducing conditions to form the thermoelectric materials.

Advantageously, the strontium titanate is at least partially reduced either by reaction with a reducing second phase that is incorporated into precursor materials used to form the strontium titanate, by exposure to reducing conditions during heating or densification, or a combination of both. In embodiments, the inventive thermoelectric material is a composite comprising strontium titanate and/or its sub-stoichiometric phases and at least one metal carbide. Unless otherwise defined, strontium titanium oxide ($SrTiO_3$) and its various sub-stoichiometric forms are referred to herein collectively as strontium titanate.

In addition to strontium and titanium, additional elements may be incorporated into the disclosed thermoelectric materials and the resulting composition may include, for example, dopants such as Ce, Nb, Ta, La, Y and other rare earth elements. Such dopant elements, if included, can substitute for Sr and/or Ti on respective cationic lattice sites and/or be incorporated on interstitial sites. Niobium-doping, for example, can create a high concentration of n-type carriers and increases the electronic conductivity by several orders of magnitude. Further, by doping with niobium, metallic-like conduction can be obtained at low oxygen activity while semiconductor behavior prevails at high oxygen activity. In embodiments, the disclosed thermoelectric materials can be co-doped, where two or more dopants are incorporated into the material (e.g., on equivalent or different lattice sites).

In embodiments, titanium may be completely or partially substituted by one or more of niobium, tantalum or vanadium. According to some embodiments, the thermoelectric materials disclosed herein may be characterized by the general formula $Sr_{1-x}D1_xTi_{1-y}D2_yO_{3-m}$, where D1 and D2 each represent one or more dopant atoms (e.g., Ce, Nb, La, Y, etc.). In the foregoing formula, D1 represents one or more dopant atoms that are incorporated on the Sr site and D2 represents one or more dopant atoms that are incorporated on the Ti site. Thus, as will be appreciated with reference to the disclosure that follows, each of D1 and D2 may represent a single type of dopant or a plurality of different dopant atoms. The subscripts x and y may independently vary over the range 0-0.4 (e.g., 0, 0.02, 0.025, 0.05, 0.075, 0.08, 0.1, 0.125, 0.15, 0.175, 0.2, 0.25, 0.3, 0.35 and 0.4), such that $0 \leq x \leq 0.4$, $0 \leq y \leq 0.4$, and $0.025 \leq (x+y) \leq 0.4$. The subscript m can range from $0 < m \leq 0.1$. In a co-doped material, $0 < x \leq 0.4$, $0 \leq y \leq 0.4$.

The effect of one or more dopants on the thermoelectric figure of merit is illustrated in FIG. 1, which is a plot of ZT values as a function of La and/or Y doping in unreduced (comparative) $SrTiO_3$ materials at 660K and 1050K. The measured ZT values are represented as circles for different La (x-axis) and Y (y-axis) concentrations. The size of the circles represents the value of ZT for each composition. The 660K data is represented by dashed circles, while the 1050K data is represented by solid circles. Referring to FIG. 1, the largest ZT value is 0.07 at 1050K for $La_{0.15}Y_{0.05}Sr_{0.8}TiO_{3-m}$.

Incorporating a single dopant yields the lowest ZT values. On the other hand, the effect of co-doping can be accretive as illustrated by comparing the increase in the ZT values for $La_xY_ySr_{0.9}TiO_{3-m}$, where x=0.05; y=0.05 relative to the singly doped compositions $D_{0.1}Sr_{0.9}TiO_{3-m}$ (D=dopant=La or Y).

Further, co-doping can be optimized. Two trends are apparent with La and Y. First, for a 1:1 ratio of La:Y, ZT is larger nearer the origin, indicating that a lower total concentration of dopants may be preferred. However, ZT can be increased further when the dopants are included in non-equal amounts. Illustrative of this is the trend at constant Y=0.05 with increasing La, where the highest ZT is achieved with La=0.15.

In view of the foregoing observed trends between doping composition(s) and the figure of merit, doped materials were reduced via (a) a heat treatment using a graphite environment, or (b) mixing the precursor materials first with 5 wt. % nano-scale titanium carbide followed by a heat treatment using a graphite environment.

The graphite heat treatment can be carried out at any suitable temperature for any effective time. The data in FIGS. 2-5 represent samples reduced using heat treatments at 1400° C. for 6 hours, though the heat treatment can be performed at 1200, 1250, 1300, 1350, 1400, 1450, 1500, 1550, 1600, 1650, 1700, 1750 or 1800° C. for a period of time ranging from 0.5 to 12 hours. In the graphite reduction, samples of the thermoelectric material to be reduced are buried within a bed of graphite powder within a suitable furnace. In an embodiment, the precursor materials can be sintered at elevated temperature (e.g., at least 900° C., 1200° C. or 1400° C.) in air or in a high oxygen partial pressure environment prior to the reducing treatment in order to form the $SrTiO_3$ phase. In addition to the $SrTiO_3$ phase formation, such a pre-treatment at elevated temperature in air or a high oxygen partial pressure environment can preferentially form a high concentration of point defects (e.g., oxygen vacancies and cationic carriers of niobium or titanium), which can be retained in the solid state upon cooling and ultimately benefit the thermoelectric properties of the resulting thermoelectric material.

In a complimentary approach, the thermoelectric material to be reduced can be mixed with a reducing agent such as titanium carbide. Titanium carbide is an example of a half-metal conducting phase that crystallizes in the rock salt structure and exhibits a wide range of stoichiometry. The composition of titanium carbide, for example, can vary as expressed by the chemical formula, $TiC_x$ (0.6<x<1). According to embodiments, the TiC powder can have a crystallite size and/or particle size of around 200 nm (e.g., from 1 to 500 nm) herein after referred to as nano-TiC.

Although titanium carbide is a relatively poor thermoelectric material, it has a high electrical conductivity and can contribute to the electrical conductivity when incorporated into a composite thermoelectric material. The thermal conductivity of titanium carbide at room temperature is on the order of about 20 W/mK. In embodiments, a reducing step was performed by first mixing the precursor materials with 5 wt. % nano-scale titanium carbide and then heat treating the composite material using a graphite environment. Although experiments were performed using 5 wt. % TiC, the amount of TiC incorporated into the precursor materials can range from about 0.25 to 10 wt. %. Thus, a doped, partially-reduced thermoelectric oxide material may comprise 0.25 to 10 wt. % TiC. In further embodiments, a reducing step was performed by first heat treating the precursor materials using a graphite environment and then incorporating into the thermoelectric material a material such as titanium carbide. Subsequent heat treating accomplished during sintering can affect a mild reduction.

In the inventive strontium titanate-titanium carbide composites, the intrinsic oxygen activity is low due to the co-existence of the oxide with the carbide. As a result, the electrical conductivity of the composite material is higher than the electrical conductivity of the oxide without any second (TiC) phase. In embodiments, the overall electrical conductivity of the composite is high due to contributions from both phases. In further embodiments, incorporation into the precursor materials of TiC can decrease the lattice thermal conductivity of the resulting thermoelectric composite relative to a single phase system.

Thus, embodiments of the disclosure relate to a reduced (e.g., partially-reduced), doped material. The reduction can be accomplished with or without the use of a reducing agent. A reducing agent, such as TiC, if used, has been demonstrated to yield a higher overall ZT value than that obtained following reduction without such a reducing agent.

Figure 2:
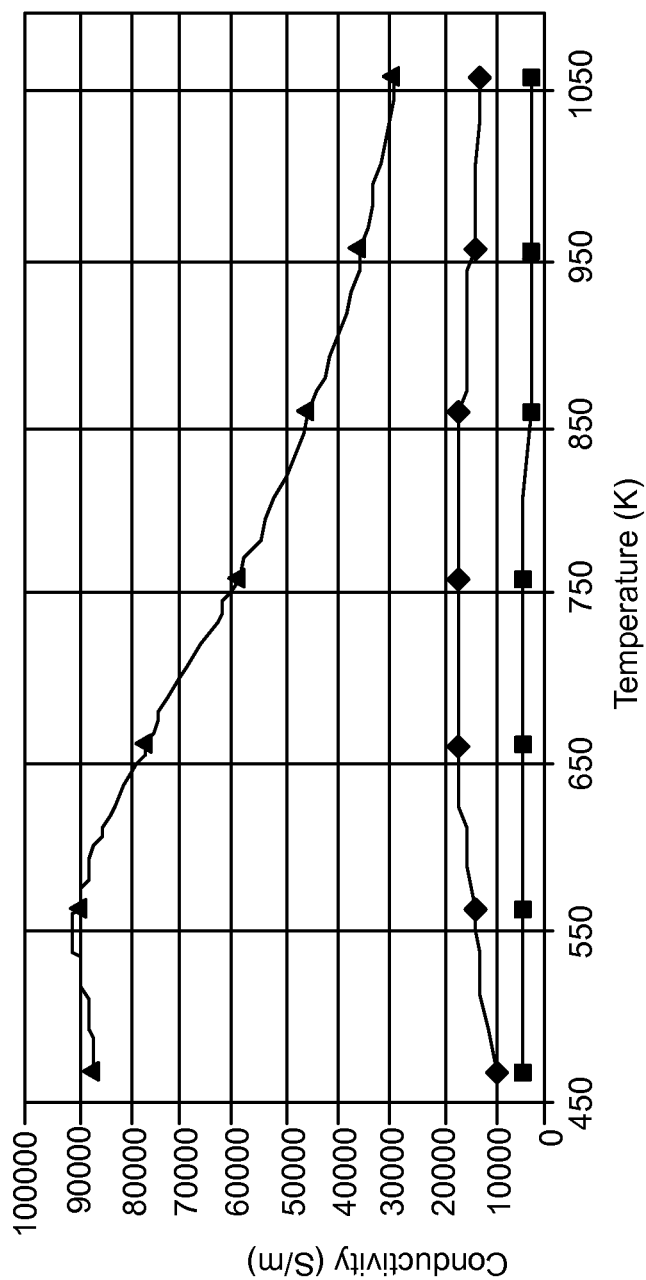
FIG. 2 is a plot of electrical conductivity versus temperature for comparative and example $SrTiO_3$-based thermoelectric materials.
Figure 3:
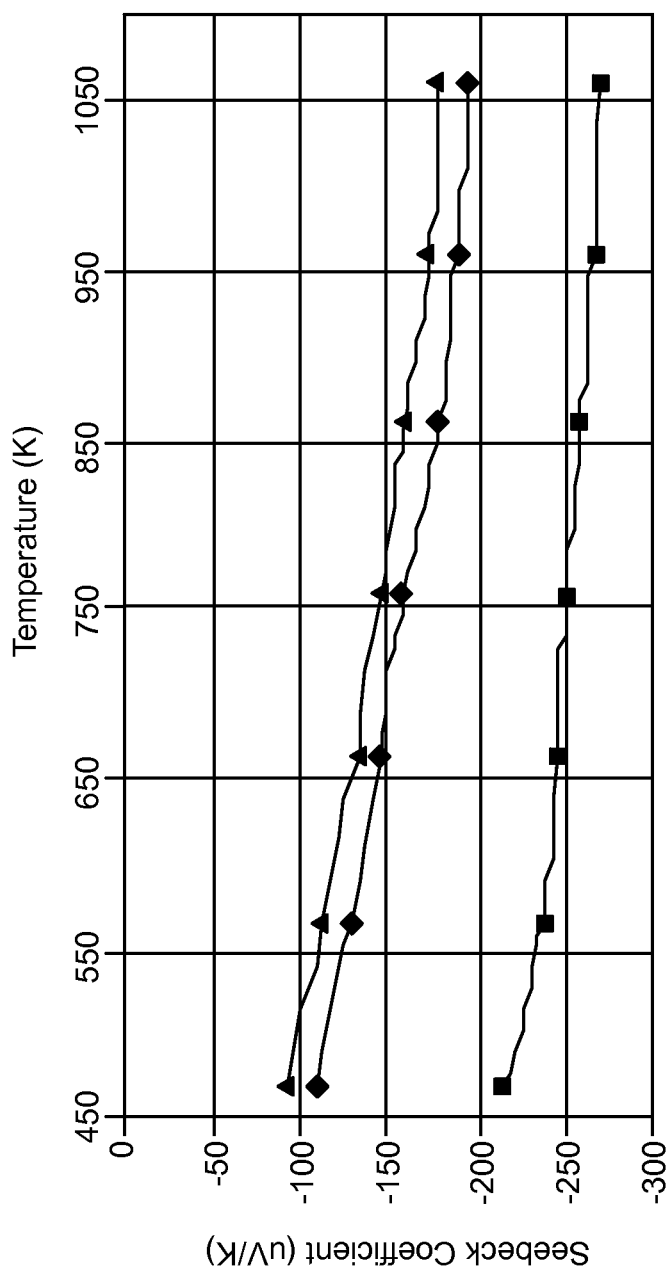
FIG. 3 is a plot of Seebeck coefficient versus temperature for comparative and example $SrTiO_3$-based thermoelectric materials.
Figure 4:
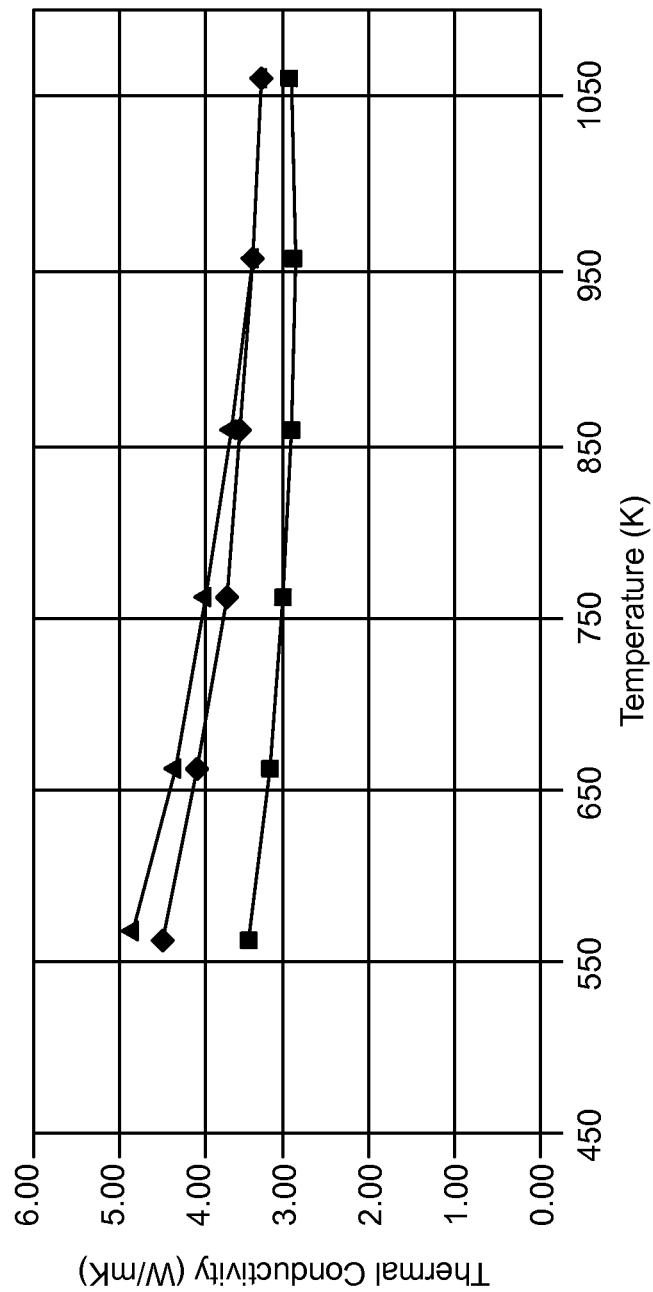
FIG. 4 is a plot of thermal conductivity versus temperature for comparative and example $SrTiO_3$-based thermoelectric materials.
Figure 5:
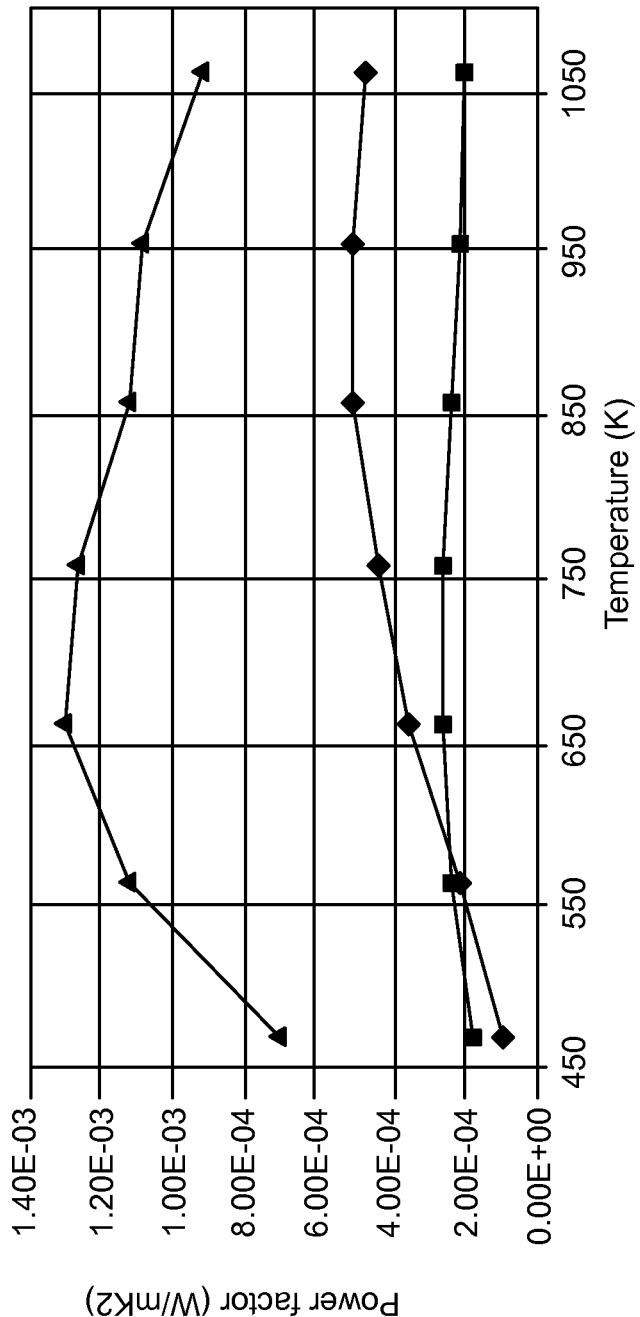
FIG. 5 is a plot of power factor versus temperature for comparative and example $SrTiO_3$-based thermoelectric materials.

The effect of the reducing treatments on the electrical conductivity of an example $La_{0.15}Y_{0.05}Sr_{0.8}TiO_{3-m}$ alloy is illustrated in FIG. 2. The effect on the Seebeck coefficient, thermal conductivity, and power factor is shown in FIG. 3-5, respectively. In FIGS. 2-5, the respective thermoelectric parameter is plotted as a function of the measurement temperature. Throughout the figures. unless otherwise stated, the filled squares represent calcined but unreduced (i.e., comparative) samples, the diamonds represent samples reduced using a heat treatment at 1400° C. for 6 hours in graphite, and the triangles represent samples reduced by first incorporating 5 wt. % nano-scale titanium carbide into the thermoelectric material composition and then heat treating at 1400° C. for 6 hours in graphite.

The sample exhibiting the highest power factor was made by incorporating 5 wt. % nano-TiC into the alloy and then heat treating at 1400° C. for 6 hours in graphite. Its low temperature thermal conductivity (triangles in FIG. 4) is only slightly higher than the 'reduced only' sample (diamonds in FIG. 4) while at higher (closer to use) temperatures its thermal conductivity is comparable.

Figure 6:
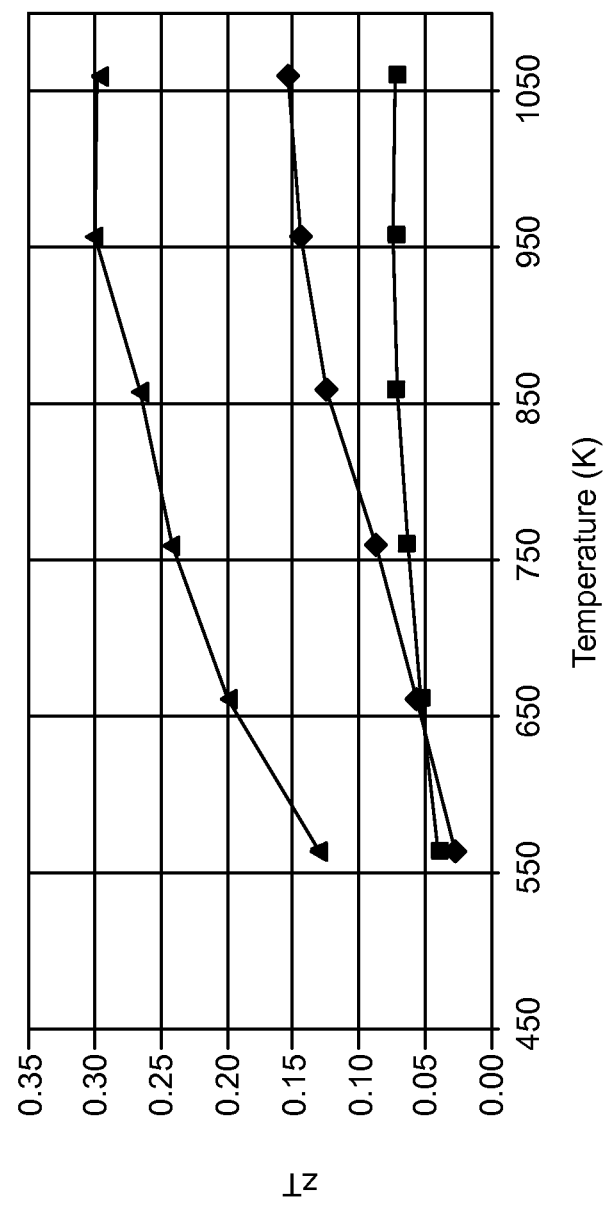
FIG. 6 is a plot of ZT versus temperature for comparative and example $SrTiO_3$-based thermoelectric materials.

Thermoelectric figure of merit (ZT) values for the data in FIG. 2-5 is summarized in FIG. 6. As illustrated, the nano TiC+heat treated sample (triangles) has a ZT value of about 0.3 at 1050K.

The large increase in electrical conductivity for the nano TiC-containing sample, relative to the heat-treated only sample is unique in that its Seebeck coefficient is not significantly decreased nor is its thermal conductivity significantly increased. The thermal conductivity data can be examined using the Wiedemann-Franz law that states that the ratio of a metal's electronic component of thermal conductivity to its total electrical conductivity is proportional to temperature according to $\kappa_{elec}/\sigma = LT$, where L is the Lorenz Number for free electrons. For free electrons, L has a value of $2.44 \times 10^{-8}$ $W/SK^2$.

Using the Wiedemann-Franz law and the assumptions inherent in it, the electron contribution of $\kappa$ can be calculated from measured properties. Since the thermal conductivity is the sum of electron and lattice components, the value of the lattice thermal conductivity can determined from the difference. For thermoelectric applications, it is generally advantageous to decrease the lattice component of the thermal conductivity, as most of the heat is carried by this mechanism. Furthermore, decreasing the lattice component of an electrically conducting material effectively breaks the connection between electrical conductivity and (total) thermal conductivity and allows for independent tailoring of the components to maximize ZT.

Figure 7:
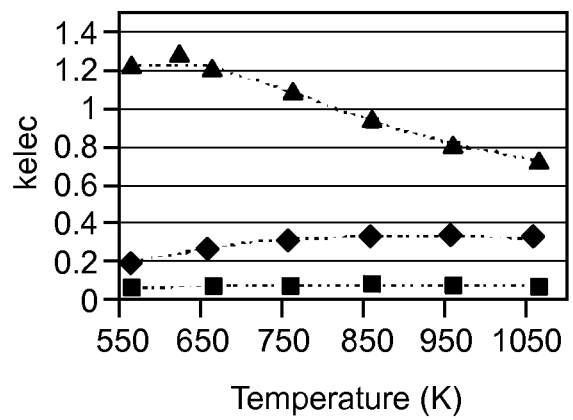
FIG. 7 is a plot of the electronic contribution to the thermal conductivity versus temperature for comparative and example $SrTiO_3$-based thermoelectric materials.
Figure 8:
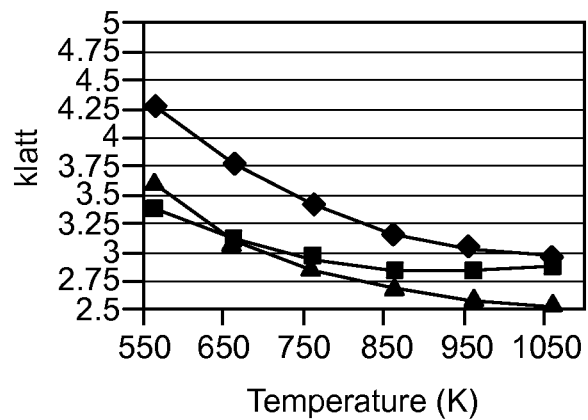
FIG. 8 is a plot of the lattice contribution to the thermal conductivity versus temperature for comparative and example $SrTiO_3$-based thermoelectric materials.

FIGS. 7 and 8 show, respectively, the electronic and lattice components to the thermal conductivity for the three samples of FIG. 2-6. With reference to FIG. 8, it is noteworthy that the lattice thermal conductivity for the reduced samples (graphite heat-treated and, in particular, nano TiC-containing with graphite heat treatment) is comparable to the lattice thermal conductivity of the calcined-only sample, suggesting that reduction and reduction in the presence of nano-TiC can be useful in decreasing the lattice component, perhaps by increasing the number of defects in the material.

Figure 9:
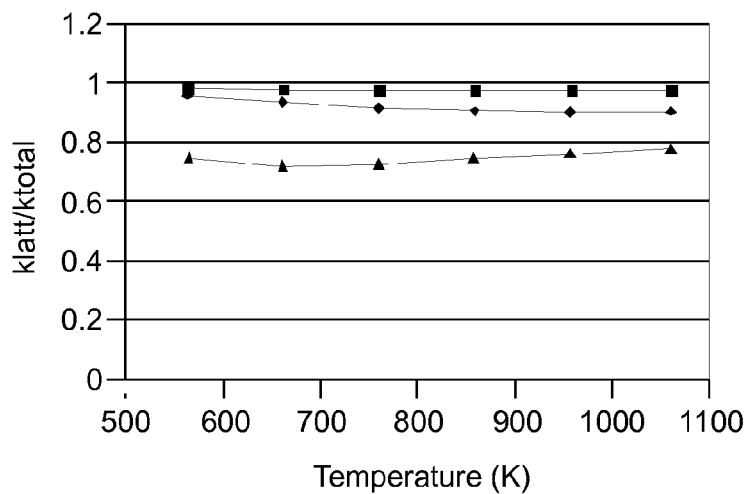
FIG. 9 is a plot of the fraction of the lattice component of the thermal conductivity to the total thermal conductivity for comparative and example $SrTiO_3$-based thermoelectric materials.

This point is further illustrated with reference to FIG. 9, which is a plot of the fraction of lattice component of the thermal conductivity to the total thermal conductivity for the three samples. The plot shows that for the calcined-only material, over 97% of its thermal conductivity is due to the lattice component. For the graphite-reduced and the TiC-containing and then graphite-reduced samples, this fraction is about 90% and about 70%, respectively, depending on the measurement temperature.

In addition to the foregoing data for the co-doped example $La_{0.15}Y_{0.05}Sr_{0.8}TiO_{3-m}$ alloy, the thermoelectric properties for $La_{0.05}Y_{0.05}Sr_{0.5}TiO_{3-m}$ were also evaluated. An analogous set of experiments were conducted resulting in densified, as-made (oxidized) material, material that was heat treated at 1400° C. for 6 hours in graphite, and material that was mixed with 5 wt. % nano-TiC and then heat treated at 1400° C. for 6 hours in graphite.

Figure 10:
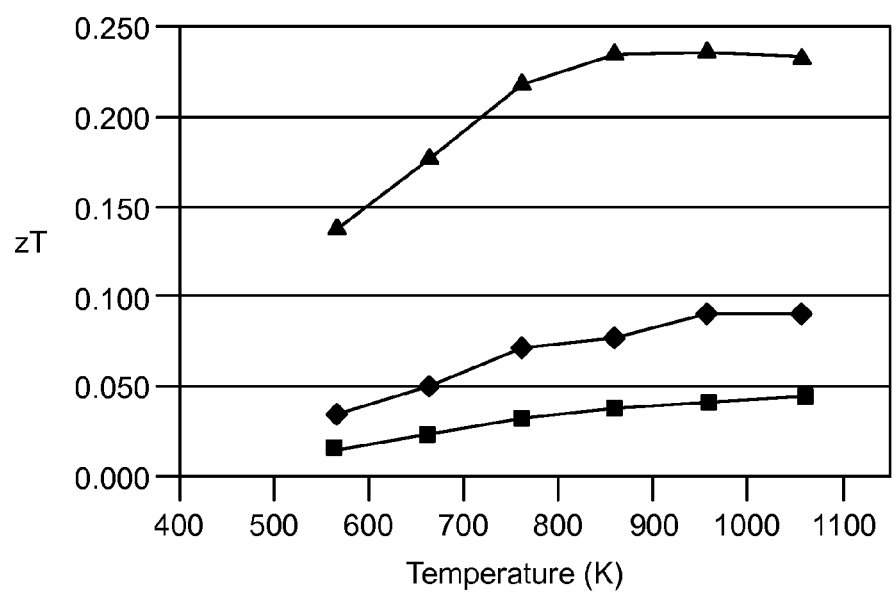
FIG. 10 is a plot of ZT versus temperature for further comparative and example $SrTiO_3$-based thermoelectric materials.

The same general trends are observed where electrical conductivity is significantly enhanced while thermal conductivity is decreased as a function of reduction. The thermoelectric figure of merit data are summarized in FIG. 10, which show that the material containing 5 wt. % TiC that was heat treated at 1400° C. exhibits a ZT value of about 0.23 at 1060K.

Figure 11:
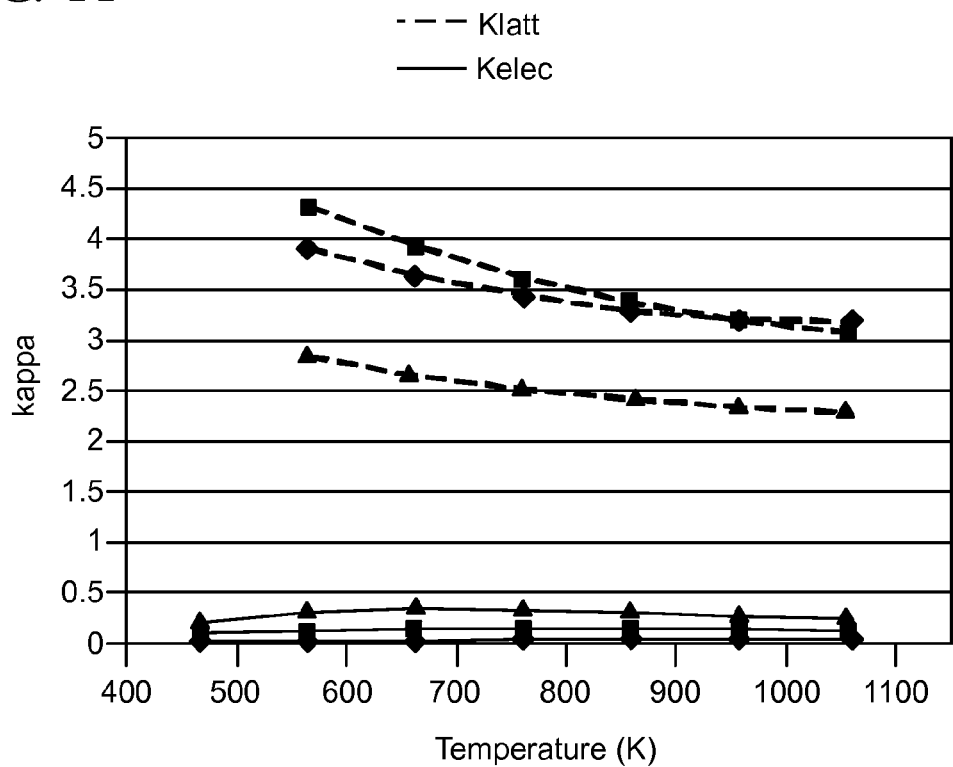
FIG. 11 is a plot of the electronic and lattice contributions to the thermal conductivity as a function of temperature for an example $SrTiO_3$-based thermoelectric material.

The effect of TiC addition on the thermal conductivity of the $La_{0.05}Y_{0.05}Sr_{0.9}TiO_{3-m}$ samples is seen in FIG. 11, where the electronic and lattice components of the total thermal conductivity are plotted. The lowest lattice thermal conductivity is exhibited by the TiC-containing material following the heat treatment at 1400° C. for 6 hours in graphite.

Figure 12:
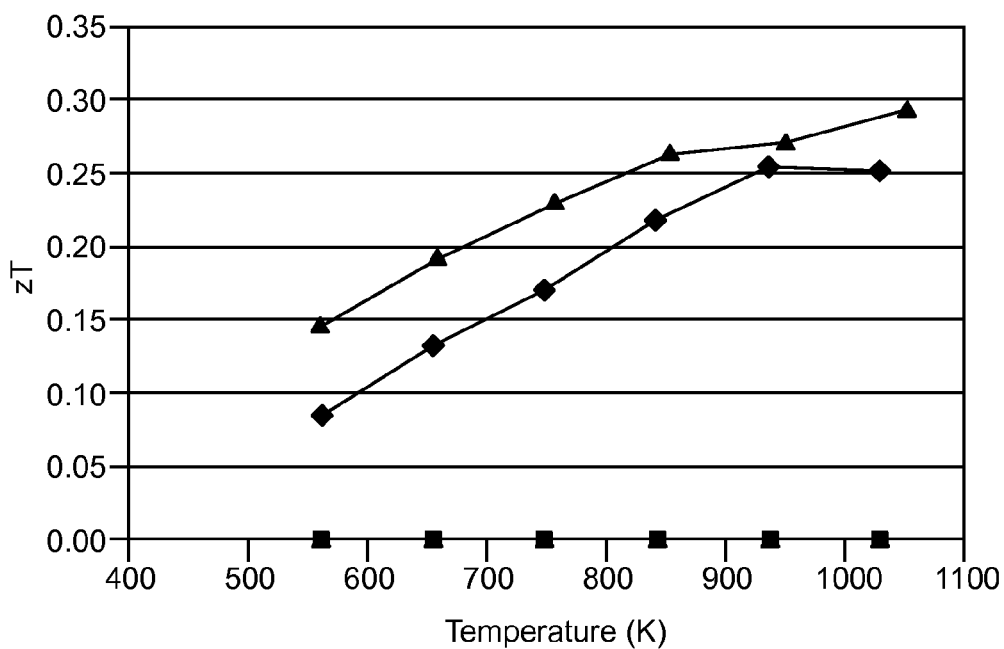
FIG. 12 is a plot of ZT versus temperature for still further comparative and example $SrTiO_3$-based thermoelectric materials.

In addition to the La, Y co-doped compositions, Nb-doped $SrTiO_3$ compositions were prepared and found to exhibit similar property enhancements when processed with TiC and a reducing heat-treatment. In various examples, the niobium is incorporated into the material on titanium lattice sites. FIG. 12 shows the ZT values as a function of temperature for a set of $Nb_{0.2}Ti_{0.8}SrO_{3-m}$ materials. The highest ZT is achieved by incorporating 5 wt. % TiC into the composition followed by a reducing heat treatment at 1400° C. for 6 hours in graphite. The electrical conductivity was increased relative to the as-made and reduced material while the thermal conductivity was decreased.

Due in part to their high figure of merit, high thermal shock resistance, thermal and chemical stability and relatively low cost, the disclosed thermoelectric materials can be used effectively and efficiently in a variety of applications, including automotive exhaust heat recovery. Though heat recovery in automotive applications involves temperatures in the range of about 400-750° C., the thermoelectric materials can withstand chemical decomposition in non-oxidizing environments or, with a protective coating, in oxidizing environments up to temperatures of 1000° C. or higher.

As disclosed herein, a method of making a thermoelectric material comprises mixing suitable starting materials, optionally heat treating or processing the starting materials at high temperature (greater than 900° C.) in air, and then heat treating the mixture in a reducing environment. In embodiments, doped $SrTiO_3$ starting materials (optionally including a reducing agent such as TiC) are prepared by turbula mixing of the appropriate oxides (and/or carbonates and/or individual elements), pressing the mixed materials into a die, and heating in air. For example, the pressing can be done in a 1.25 inch diameter die at about 4000 psi, following by heating in air at 1200° C. for 8 hours.

The resulting pellets can then be combined, rehomogenized by grinding, and pressed again into pellets, which can be heated (e.g., in air at 1200° C.). The resulting doped $SrTiO_3$ material can be reground and then reduced. As disclosed earlier, the act of reducing the thermoelectric material can comprise a heating step in graphite or, alternatively, incorporation of a reducing agent into the material followed by a heating step in graphite.

In one embodiment, pellets are cold-pressed and then buried in a bed of graphite. The assembly is placed into a furnace and heated, for example, at 1400° C. for 6 hours. After reduction, the material can be milled and sieved prior to densification. An example sieve size is 45 microns (or about 325 mesh).

In a further embodiment, nano-TiC can be mixed (e.g., turbula mixed) with the doped $SrTiO_3$ material prior to heating in the bed of graphite.

The prepared powders can be densified using spark plasma sintering (SPS). In an example method, a powder mixture can be placed into a graphite die, which is loaded into a Spark Plasma Sintering (SPS) apparatus where the powder mixture is heated and densified under vacuum and under applied pressure using a rapid heating cycle. Spark Plasma Sintering is also referred to as Field Assisted Sintering Technique (FAST) or Pulsed Electric Current Sintering (PECS). Other types of sintering can be used, such as HP or natural sintering in a reducing environment. Of course, other types of apparatus can be used to mix and compact the powder mixture. For example, powders can be mixed using ball milling or spray drying. Compaction of the mixture may be accomplished using a uniaxial or isostatic press.

Figure 13:
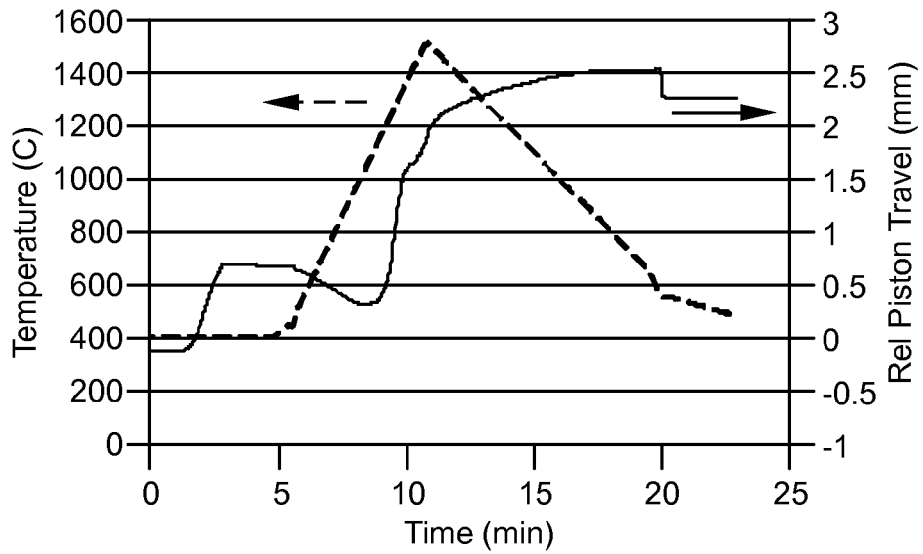
FIG. 13 is a plot of temperature and piston travel as a function of time according to an example densification method for forming thermoelectric materials according to various embodiments.
Figure 14:
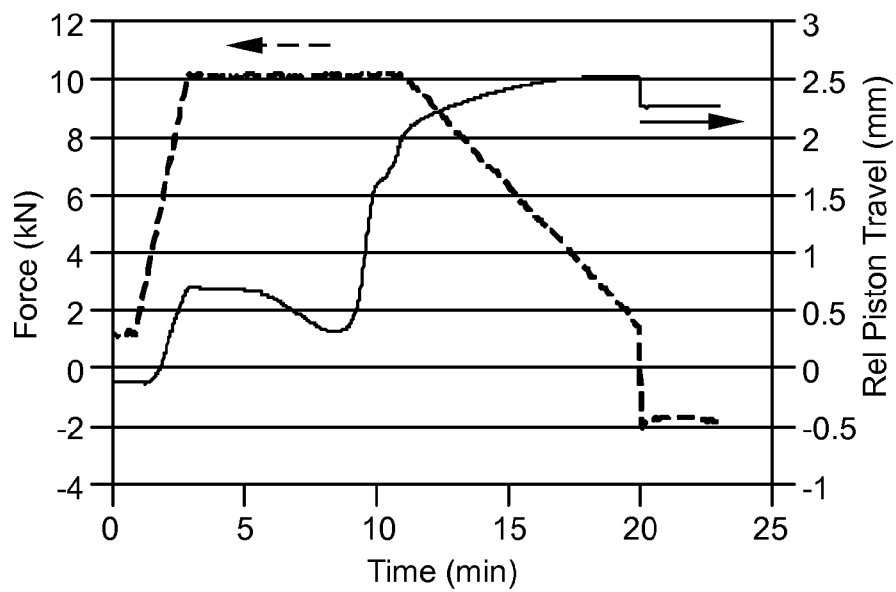
FIG. 14 is a plot of force and piston travel as a function of time for the data illustrated in FIG. 13.

Run data from a representative SPS sintering run are shown in FIGS. 13 and 14. In an example method, approximately 5 grams of material are densified using a 20 mm graphite die and piston assembly in the SPS apparatus. The compressed ceramics were found to be >98% dense.

Although FIG. 13 discloses a particular heating cycle, and FIG. 14 discloses a corresponding force profile, heating cycles with hold (maximum) temperatures of from about 900-1400° C. can be used in conjunction with heating rates from about 450° C. to the hold temperature of greater than 100° C./min (e.g., between about 100 and 400° C./minute), and hold times of from about 30 seconds to 10 minutes. A pressure of between about 3 to 60 MPa can be applied to the powder mixture to affect densification.

Thermoelectric properties were obtained from samples that were cut into coupons measuring 2-3 mm×2-3 mm×12-14 mm. Both the Seebeck coefficient and the electrical conductivity were measured simultaneously using a ULVAC-ZEM3 device from room temperature up to 800° C. The thermal conductivity was obtained at various temperatures from the product of the heat capacity and the thermal diffusivity, which were determined using a thermal property analyzer (Anter Corp., Pittsburgh, Pa.) and the bulk density of the material.

The electrical conductivity and Seebeck coefficient can show inverse responses to parameter changes. For example, an increase in the maximum SPS heating temperature increases the electrical conductivity but decreases the Seebeck coefficient. Faster heating rates and shorter dwell times also promote an increase in Seebeck coefficient at lower electrical conductivity.

In embodiments, the disclosed thermoelectric materials have an electrical conductivity greater than $10^3$ S/m, a Seebeck coefficient (absolute value) greater than 100 μV/K, and a thermal conductivity κ over a temperature range of 400-1200K of less than 6 W/mK. By way of example, the electrical conductivity can be greater than $10^3$, $2\times10^3$, $3\times10^3$, $4\times10^3$, $5\times10^3$, $6\times10^3$, $7\times10^3$, $8\times10^3$, $9\times10^3$, $10^4$, $2\times10^4$, $3\times10^4$, $4\times10^4$, $5\times10^4$, $6\times10^4$, $7\times10^4$, $8\times10^4$, $9\times10^4$ or $10^5$ S/m, the absolute value of the Seebeck coefficient can be greater than 100, 150, 200, 250, 300 or 350 μV/K, and the thermal conductivity over the range of 400-1200K can be less than 6, 5.5, 5, 4.5, 4, 3.5, 3, 2.5, 2 or 1.5 W/mK. Further, the electrical conductivity, Seebeck coefficient and thermal conductivity may have values that extend over a range where the minimum and maximum values of the range are given by the values above. For example, a thermoelectric material that has an electrical conductivity greater than $10^3$ S/m can also be defined as having an electrical conductivity between $2\times10^4$ and $10^5$ S/m.

Recalling that the power factor is defined as PF=σS², and the figure of merit is defined as ZT=σS²T/κ, according to embodiments the disclosed thermoelectric material has a power factor times temperature at 1000 K greater than about 0.1 W/mK (e.g., greater than 0.1, 0.2, 0.3, 0.4, 0.5, 0.6, 0.7, 0.8, 0.9, 1.0, 1.1, 1.2 or 1.3 W/mK) and a figure of merit at 1000K greater than about 0.2 (e.g., greater than 0.2, 0.25, 0.3 or 0.35). Further, values of power factor times temperature and figure of merit may extend over a range where the minimum and maximum values of the range are given by the values above.

Table 1 lists several exemplary doped and co-doped SrTiO₃-based thermoelectric compositions that were reduced and evaluated according to the processing methods disclosed herein. Omitted from the compositional data listed in Table 1 is presence in some samples of titanium carbide or other reducing agent, which may be added to the composition before or after a thermal reduction step in graphite.

TABLE 1

Example doped and co-doped thermoelectric oxide compositions

| Sample | | La | Y | Sr | ZT@1050 K |
|---|---|---|---|---|---|
| 1 | As-made* | 0.025 | 0.025 | 0.95 | 0.062 |
|   | Graphite | 0.025 | 0.025 | 0.95 | 0.14 |
|   | TiC + graphite | 0.025 | 0.025 | 0.95 | 0.17 |
| 2 | As-made* | 0.05 | — | 0.95 | 0.032 |
|   | Graphite | 0.05 | — | 0.95 | 0.091 |
|   | TiC + graphite | 0.05 | — | 0.95 | 0.15 |
| 3 | As-made* | — | 0.05 | 0.95 | 0.016 |
|   | Graphite | — | 0.05 | 0.95 | 0.05 |
|   | TiC + graphite | — | 0.05 | 0.95 | 0.13 |
| 4 | As-made* | 0.02 | 0.08 | 0.9 | 0.027 |
|   | Graphite | 0.02 | 0.08 | 0.9 | 0.011 |
|   | TiC + graphite | 0.02 | 0.08 | 0.9 | 0.235 |
| 5 | As-made* | 0.08 | 0.02 | 0.9 | 0.012 |
|   | Graphite | 0.08 | 0.02 | 0.9 | 0.03 |
|   | TiC + graphite | 0.08 | 0.02 | 0.9 | 0.19 |

TABLE 1-continued

Example doped and co-doped thermoelectric oxide compositions

| Sample | | La | Y | Sr | ZT@1050 K |
|---|---|---|---|---|---|
| 6 | As-made* | 0.05 | 0.05 | 0.9 | 0.025 |
|   | Graphite | 0.05 | 0.05 | 0.9 | 0.11 |
|   | TiC + graphite | 0.05 | 0.05 | 0.9 | 0.28 |
| 7 | As-made* | 0.1 | — | 0.9 | 0.01 |
|   | Graphite | 0.1 | — | 0.9 | 0.16 |
|   | TiC + graphite | 0.1 | — | 0.9 | 0.19 |
| 8 | As-made* | — | 0.1 | 0.9 | 0.14 |
|   | Graphite | — | 0.1 | 0.9 | n/a |
|   | TiC + graphite | — | 0.1 | 0.9 | 0.2 |
| 9 | As-made* | 0.1 | 0.1 | 0.8 | 0.02 |
|   | Graphite | 0.1 | 0.1 | 0.8 | 0.1 |
|   | TiC + graphite | 0.1 | 0.1 | 0.8 | 0.3 |
| 10 | As-made* | 0.15 | 0.05 | 0.8 | 0.07 |
|   | Graphite | 0.15 | 0.05 | 0.8 | 0.15 |
|   | TiC + graphite | 0.15 | 0.05 | 0.8 | 0.33 |

*the as-made samples are un-reduced and comparative.

The thermoelectric figure of merit for the doped, partially-reduced thermoelectric oxide materials disclosed herein is at least 0.01 at 1050K (e.g., at least 0.01, 0.05, 0.1, 0.15, 0.2, 0.25 or 0.3 at 1050K).

As used herein, the singular forms "a," "an" and "the" include plural referents unless the context clearly dictates otherwise. Thus, for example, reference to "an oxide" includes examples having two or more such "oxides" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made to the present invention without departing from the spirit and scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A co-doped, partially-reduced thermoelectric oxide material represented by a formula:

$$Sr_{1-x}D1_xTi_{1-y}D2_yO_{3-m},$$

where D1 and D2 each represent one or more dopant atoms selected from the group consisting of Ce, Nb, Ta, La, Y, and other rare earth elements;

$0<x\leq0.4$, $0<y\leq0.4$, $0.025\leq(x+y)\leq0.4$ and m defines an oxygen non-stoichiometry with $0<m\leq0.1$.

2. The doped, partially-reduced thermoelectric oxide material according to claim 1, wherein a thermoelectric figure of merit for the material at 1050K is greater than 0.2.

3. The doped, partially-reduced thermoelectric oxide material according to claim 1, further comprising from about 0.25 to 10 wt. % TiC.

4. The doped, partially-reduced thermoelectric oxide material according to claim 1, wherein a thermal conductivity of the material is less than 6 W/mK over a temperature range of 400-1200K.

5. A thermoelectric device comprising the doped, partially-reduced thermoelectric oxide material according to claim 1.

6. A method of making a doped, partially-reduced thermoelectric oxide material, said method comprising:

combining raw materials to form a mixture, surrounding the mixture with graphite; and heating the mixture to form a partially-reduced thermoelectric oxide material, wherein the doped, partially-reduced thermoelectric oxide material is represented by a formula:

$$Sr_{1-x}D1_xTi_{1-y}D2_yO_{3-m},$$

where D1 and D2 each represent one or more dopant atoms selected from the group consisting of Ce, Nb, Ta, La, Y and other rare earth elements;

$0 \leq x \leq 0.4$, $0 \leq y \leq 0.4$, $0.025 \leq (x+y) \leq 0.4$ and m defines an oxygen non-stoichiometry with $0 < m \leq 0.1$.

7. The method according to claim 6, wherein the combining is done in air at a temperature of at least 900° C.

8. The method according to claim 6, wherein the combining comprises forming the mixture of raw materials into a pellet.

9. The method according to claim 6, wherein the raw materials comprise oxides.

10. The method according to claim 6, wherein the raw materials include a reducing agent.

11. The method according to claim 10, wherein the reducing agent comprises titanium carbide.

12. The method according to claim 6, wherein the heating temperature ranges from 1200 to 1800° C.

* * * * *